(12) United States Patent
Otsuka et al.

(10) Patent No.: US 8,762,810 B2
(45) Date of Patent: Jun. 24, 2014

(54) SEMICONDUCTOR RECORDING DEVICE, CONTROL METHOD OF SEMICONDUCTOR RECORDING DEVICE, AND SEMICONDUCTOR RECORDING SYSTEM

(75) Inventors: Takeshi Otsuka, Hyogo (JP); Hideaki Yamashita, Kyoto (JP)

(73) Assignee: Panasonic Corporation, Osaka (JP)

( * ) Notice: Subject to any disclaimer, the term of this patent is extended or adjusted under 35 U.S.C. 154(b) by 608 days.

(21) Appl. No.: 12/978,766

(22) Filed: Dec. 27, 2010

(65) Prior Publication Data

US 2011/0161779 A1    Jun. 30, 2011

(30) Foreign Application Priority Data

Dec. 28, 2009 (JP) ................................. 2009-297391

(51) Int. Cl.
*G06F 11/00* (2006.01)

(52) U.S. Cl.
USPC ........................................................ 714/758

(58) Field of Classification Search
CPC .... G06F 11/107; G06F 11/10; G06F 12/0246
USPC ........................................................ 714/758
See application file for complete search history.

(56) References Cited

U.S. PATENT DOCUMENTS

| | | | |
|---|---|---|---|
| 6,161,192 A * | 12/2000 | Lubbers et al. | 714/6.21 |
| 7,085,819 B2 * | 8/2006 | Bright et al. | 709/217 |
| 7,536,495 B2 * | 5/2009 | Ashmore et al. | 710/313 |
| 2009/0019210 A1 * | 1/2009 | Asari et al. | 711/102 |
| 2009/0228653 A1 * | 9/2009 | Yamagami | 711/114 |
| 2011/0161779 A1 * | 6/2011 | Otsuka et al. | 714/758 |
| 2012/0221533 A1 * | 8/2012 | Burness et al. | 707/690 |
| 2012/0284587 A1 * | 11/2012 | Yu et al. | 714/773 |

FOREIGN PATENT DOCUMENTS

JP    2006-18373    1/2006

* cited by examiner

*Primary Examiner* — Amine Riad
(74) *Attorney, Agent, or Firm* — Wenderoth, Lind & Ponack, L.L.P.

(57) ABSTRACT

Included are a flash memory onto which user data and parity data are recorded, an external interface unit which receives a first write command for instructing recording of the user data onto the flash memory, and a block managing unit which manages management information indicating whether parity data is valid or invalid. When the user data related to the first write command received through the external interface unit is recorded onto the flash memory 18, the block managing unit updates the management information so as to indicate that the parity data corresponding to the user data is invalid.

15 Claims, 14 Drawing Sheets

FIG. 5A

| Logical block number | 0 | 1 | 2 | 3 | ... | 799 |
|---|---|---|---|---|---|---|
| Physical block number | 0-0<br>1-300<br>2-600<br>3-900 | 0-100<br>1-400<br>2-700<br>3-1000 | 0-200<br>1-500<br>2-800<br>3-0 | 0-300<br>1-600<br>2-900<br>3-100 | ... | 0-1024<br>1-1024<br>2-1024<br>3-1024 |

FIG. 5B

| Parity block number | 0 | 1 | ... | 199 |
|---|---|---|---|---|
| Physical block number | 0-400<br>1-700<br>2-1000<br>3-200 | 0-1024<br>1-1024<br>2-1024<br>3-1024 | ... | 0-1024<br>1-1024<br>2-1024<br>3-1024 |

FIG. 6

| Logical block number | 0 | 1 | 2 | 3 | 4 | ..... | 799 |
|---|---|---|---|---|---|---|---|
| Validity of user data | 1 | 1 | 1 | 1 | 0 | ..... | 0 |
| Validity of parity data | 1 | 1 | 1 | 0 | 0 | ..... | 0 |

| Logical block number | 0 | 1 | 2 | 3 | ... | 999 |
|---|---|---|---|---|---|---|
| Physical block number | 0-0<br>1-300<br>2-600<br>3-900 | 0-100<br>1-400<br>2-700<br>3-1000 | 0-200<br>1-500<br>2-800<br>3-0 | 0-300<br>1-600<br>2-900<br>3-100 | ... | 0-1024<br>1-1024<br>2-1024<br>3-1024 |

| Parity block number | 0 | 1 | 2 | 3 | ... | 999 |
|---|---|---|---|---|---|---|
| Physical block number | 4-200 | 4-300 | 4-400 | 4-500 | ... | 4-1024 |

FIG. 12

| Parity block number | 0 | 1 | 2 | 3 | 4 | ... | 999 |
|---|---|---|---|---|---|---|---|
| Page 0 | 1 | 1 | 1 | 1 | 0 | ------ | 0 |
| Page 1 | 1 | 1 | 1 | 1 | 0 | ------ | 0 |
| Page 2 | 1 | 1 | 1 | 0 | 0 | ------ | 0 |
| Page 3 | 1 | 1 | 1 | 0 | 0 | ------ | 0 |
| Page 4 | 1 | 1 | 1 | 0 | 0 | ------ | 0 |
| ------ | ------ | ------ | ------ | ------ | ------ | ------ | ------ |
| Page 63 | 1 | 1 | 1 | 0 | 0 | ------ | 0 |

SEMICONDUCTOR RECORDING DEVICE, CONTROL METHOD OF SEMICONDUCTOR RECORDING DEVICE, AND SEMICONDUCTOR RECORDING SYSTEM

BACKGROUND OF THE INVENTION (1) Field of the Invention

The present invention relates to a semiconductor recording device such as a memory card, a control method thereof, and a semiconductor recording system, and in particular, to a control method which reduces variation in data holding characteristics of a non-volatile memory within the semiconductor recording device and deterioration of the non-volatile memory caused due to repeated writings.

(2) Description of the Related Art

Conventionally, a semiconductor recording device, such as an SD (Secure Digital) card that is a card-type recording medium incorporating a flash memory, is very small and thin. Due to its handiness, such semiconductor recording device is widely used for recording data, such as images, in a digital camera, a portable equipment and so on.

The flash memory in the semiconductor recording device is a memory which includes physical blocks of a uniform size, and which can erase data on a physical block basis. To address a demand for an increased capacity in recent years, a multi-level flash memory capable of storing data of two bits or more in one cell has been commercialized.

Reference is made to a four-level flash memory as an example of the multi-level flash memory, with reference to FIG. 1. FIG. 1 is a diagram showing relationship between an accumulating state of electrons in a floating gate of the four-level flash memory and a threshold voltage (Vth).

As shown in FIG. 1, in the four-level flash memory, the electron accumulating state in the floating gate is managed in four states according to its threshold voltage (Vth). In FIG. 1, the state where the number of accumulated electrons (the charge amount of electrons) is lower and an electric potential is lowest is an erase state. This state is defined as (1, 1). As more electrons are accumulated, the threshold voltage discretely rises. These states are defined as (1, 0), (0, 0) and (0, 1). Since the electrical potential rises in proportion to the number of accumulated electrons in such a manner, the electron accumulating state can be controlled in four states so as to fall below a predetermined threshold value. Accordingly, data of two bits can be recorded in one memory cell.

However, the four states are identified depending on the charge amount of electrons in the four-level flash memory. Therefore, the differences of the threshold voltage between each state in the four-level flash memory are smaller than the difference of the threshold voltage between the states in a binary flash memory.

When data writing is repeated, the gate oxide film is slightly damaged due to injection and extraction of electrons. The repeated damages generate many electron traps, which results in a decrease in the number of electrons accumulated in the actual floating gate. Furthermore, the number of electrons accumulated in the floating gate decreases in proportion to miniaturization in the semiconductor process rules; and thus, advanced miniaturization of the flash memory increases the influences of the electron traps.

With advent of multi-value record which supports increased capacity of flash memories and miniaturization in the semiconductor process rules, deterioration of data holding characteristics of the flash memories has become a noticeable problem.

As a method for improving data holding characteristics of the flash memories, there is a proposed method in which error correction capability is enhanced.

For example, Japanese Unexamined Patent Application Publication No. 2006-18373 discloses a technique for enhancing error correction capability and reducing deterioration in data holding characteristics of the flash memories. In this technique, blocks in different chips in a flash memory are associated with one another, a plurality of associated blocks are handled as a common group, and one block in the group is assigned to a parity block for user data written into another block in the group.

There are two conventional schemes for associating a logical address issued by a host device, and a user-data write area and a parity-data write area that correspond to the logical address.

In the first conventional scheme, in a semiconductor recording device incorporating flash memory chips therein, one flash memory chip is used as a write area for parity data and the other flash memory chips are used as a write area for user data (this scheme corresponds to RAID4 (Redundant Arrays of Independent Disks 4) of a hard disk).

In the second conventional scheme, a user-data write area and a parity-data write area each are divided into pages of a flash memory, flash memory chips corresponding to the parity-data write area are sequentially moved. As a result, parity data is approximately evenly assigned to the respective flash memory chips, and a table is recorded which stores unique correspondence between parity data and logical addresses issued by the host device (this scheme corresponds to RAID5).

When applying such structure of the semiconductor recording device to a removable semiconductor recording device such as a memory card, a first scheme, in which a parity processing circuit is included in a memory card, and a second scheme, in which a parity processing circuit is provided outside a memory card, are possibly used.

In the first scheme in which the parity processing circuit is included in the memory card, a dedicated hardware is required; and thus, a problem exists in that inexpensive memory cards cannot be provided. On the other hand, the second scheme in which the parity processing circuit is provided outside the memory card can be achieved relatively inexpensively by using the CPU of the host device for parity processing.

In the case where the second scheme is applied to a general-purpose computer, the following two schemes (a) and (b) are possibly used. The scheme (a) is a scheme where parity data is generated by an application and recorded as a file. The scheme (b) is a scheme where parity data is generated by a dedicated driver of a memory card and recorded.

A problem exists in the scheme (a) that user data and its related parity data are not written in association with a logical address having a given relationship; and thus, the scheme (a) is not effective to improve data holding characteristics of the flash memory.

In the scheme (b), user data and its related parity data are written in association with a logical address having a given relationship.

However, in the case where user data is overwritten by a general-purpose driver which does not have a function to process parity data, onto a memory card to which parity data is already written by a dedicated driver, the relevance between the user data written by the general-purpose driver and the written parity data is lost. In this case, if an error generated in the user data after being overwritten is corrected by parity data which has no relevance with the user data, the correction results in a false correction.

SUMMARY OF THE INVENTION

The present invention has been conceived to solve the problems, and has an object to provide a semiconductor recording device, a control method thereof and the like which prevent false correction caused due to irrelevant parity data.

In order to solve the problems, a semiconductor recording device according to an aspect of the present invention includes: a non-volatile memory on which user data and parity data are to be recorded; an interface unit which receives a first write command for instructing recording of the user data onto the non-volatile memory; and a managing unit which manages management information indicating whether the parity data is valid or invalid. When the user data related to the first write command received through the interface unit is recorded onto the non-volatile memory, the managing unit updates the management information so as to indicate that the parity data corresponding to the user data is invalid.

With the structure, when recording, onto a non-volatile memory, user data related to a first write command, parity data which has already been recorded in the area specified by the first write command is invalidated, thereby detecting inconsistency between the user data and the parity data.

Furthermore, it is preferable that the semiconductor recording device according to an aspect of the present invention includes a management table which stores the management information, and that the managing unit manages the management information by updating the management information stored in the management table.

Furthermore, in the semiconductor recording device according to an aspect of the present invention, it is preferable that the non-volatile memory includes a block that is a unit of erasing, and the management information is stored per block in the management table.

Furthermore, in the semiconductor recording device according to an aspect of the present invention, it is preferable that the non-volatile memory includes a block having a plurality of pages, each of the pages being a minimum unit of recording, and the management information is stored per page in the management table.

Furthermore, in the semiconductor recording device according to an aspect of the present invention, it is preferable that the interface unit receives a second write command for instructing recording of the parity data, the semiconductor recording device further includes a command analyzing unit which identifies whether a received command is the first write command or the second write command, and the managing unit (i) updates the management information so as to indicate that the parity data is invalid, in the case where the command analyzing unit identifies that the received write command is the first write command, and (ii) updates the management information so as to indicate that the parity data is valid, in the case where the command analyzing unit identifies that the received write command is the second write command.

Furthermore, in the semiconductor recording device according to an aspect of the present invention, it is preferable that the interface unit receives the second write command after receiving the first write command, and the managing unit updates the management information according to the second write command so as to indicate that the parity data is valid, after updating the management information according to the first write command so as to indicate that the parity data is invalid.

Furthermore, it is preferable that the semiconductor recording device according to an aspect of the present invention includes an ECC processing unit which generates the parity data corresponding to the user data related to the first write command, and generate an ECC code including the user data and the parity data.

Furthermore, it is preferable that the semiconductor recording device according to an aspect of the present invention includes a command analyzing unit which analyzes the first write command to detect whether or not a size of the first write command is integral multiple of a predetermined size, wherein the ECC processing unit which (i) generates the ECC code in the case where the command analyzing unit detects that the size of the first write command is integral multiple of the predetermined size, and (i) does not generate the ECC code in the case where the command analyzing unit detects that the size of the write command is not integral multiple of the predetermined size.

Furthermore, in the semiconductor recording device according to an aspect of the present invention, it is preferable that the managing unit (i) updates the management information so as to indicate that the recorded parity data is valid, in the case where the command analyzing unit detects that the size of the first write command is integral multiple of the predetermined size, and (ii) updates the management information so as to indicate that the recorded parity data is invalid, in the case where the command analyzing unit detects that the size of the first write command is not integral multiple of the predetermined size.

Furthermore, a semiconductor recording system according to an aspect of the present invention includes a host device and a semiconductor recording device, wherein the host device includes: an external interface unit which transmits and receive a command to and from the semiconductor recording device, an ECC processing unit which generates parity data corresponding to user data, and an ECC code including the user data and the parity data; a first command processing unit which generates a first write command related to the user data; and a second command processing unit which generates a second write command related to the parity data, wherein the semiconductor recording device includes: a non-volatile memory on which the user data and the parity data are to be recorded; an interface unit which receives the first write command for instructing recording of the user data onto the non-volatile memory; and a managing unit which manages management information indicating whether the parity data is valid or invalid, wherein, when the user data related to the first write command received through the external interface unit is recorded onto the non-volatile memory, the managing unit updates the management information so as to indicate that the parity data corresponding to the user data is invalid.

Furthermore, in the semiconductor recording system according to an aspect of the present invention, it is preferable that when transmitting the first write command and the second write command to the semiconductor recording device through the external interface unit, the host device transmits the second write command after transmitting the first write command, the semiconductor recording device further includes a management table, and the management unit (i) updates the management information at a start of recording the user data corresponding to the first write command, so as to indicate that the parity data is invalid, and (ii) updates the management information at an end of recording the parity data corresponding to the second write command, so as to indicate that the parity data is valid.

Furthermore, in the semiconductor recording system according to an aspect of the present invention, it is preferable that the managing unit selectively performs a write operation that is based on the second write command.

Furthermore, in the semiconductor recording system according to an aspect of the present invention, it is preferable that the first command processing unit generates the first write command by using a general-purpose driver.

Furthermore, in the semiconductor recording system according to an aspect of the present invention, it is preferable that the managing unit records the parity data corresponding to the second write command in an area of the non-volatile memory, the area being inaccessible by a general-purpose driver.

Furthermore, a method for controlling a semiconductor recording device according to an aspect of the present invention is a method for controlling a semiconductor recording device which includes a non-volatile memory on which user data and parity data are to be recorded; an interface unit which receives a first write command for instructing recording of the user data onto the non-volatile memory; and a managing unit which manages management information indicating whether the parity data is valid or invalid. The method includes: updating the management information so as to indicate that the parity data corresponding to the user data is invalid, when the user data related to the first write command received through the interface unit is recorded onto the non-volatile memory.

According to the present invention, even if a semiconductor recording device is, for example, removed immediately after user data corresponding to a first write command is written, parity data associated with the user data is invalidated; and thus, it is possible to detect inconsistency between the user data and the parity data. Accordingly, in the case where an error in reading user data occurs, use of the parity data that is inconsistent with the user data can be prohibited. As a result, it is possible to prevent a false detection caused by performing a correction using parity data irrelevant with the user data.

FURTHER INFORMATION ABOUT TECHNICAL BACKGROUND TO THIS APPLICATION

The disclosure of Japanese Patent Application No. 2009-297391 filed on Dec. 28, 2009 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 5A is a diagram illustrating an example of a logical-to-physical conversion table for logical blocks in the semiconductor recording device according to Embodiment 1 of the present invention;

FIG. 5B is a diagram illustrating an example of a logical-to-physical conversion table for parity blocks in the semiconductor recording device according to Embodiment 1 of the present invention;

FIG. 6 illustrates an example of an ECC (Error Correcting Code) parity management table in the semiconductor recording device according to Embodiment 1 of the present invention 1;

FIG. 11A is a diagram illustrating an example of a logical-to-physical conversion table for logical blocks in the semiconductor recording device according to Embodiment 2 of the present invention;

FIG. 11B is a diagram illustrating an example of a logical-to-physical conversion table for parity blocks in the semiconductor recording device according to Embodiment 2 of the present invention;

FIG. 12 illustrates an example of an ECC parity management table in the semiconductor recording device according to Embodiment 2 of the present invention;

DESCRIPTION OF THE PREFERRED EMBODIMENT(S)

Hereinafter, reference is made to a semiconductor recording device, a control method thereof, and a semiconductor recording system according to Embodiments of the present invention, with reference to the drawings.

Embodiment 1

Figure 1:
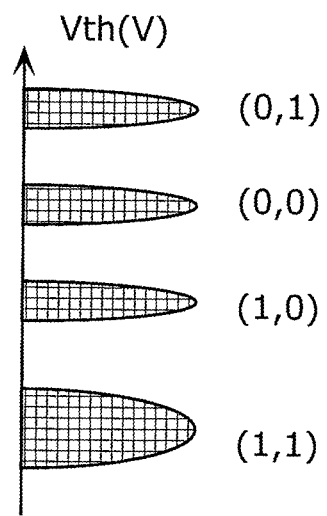
FIG. 1 is a diagram illustrating relationship between an accumulating state of electrons in a floating gate of the four-level flash memory and a threshold voltage (Vth)
Figure 2:
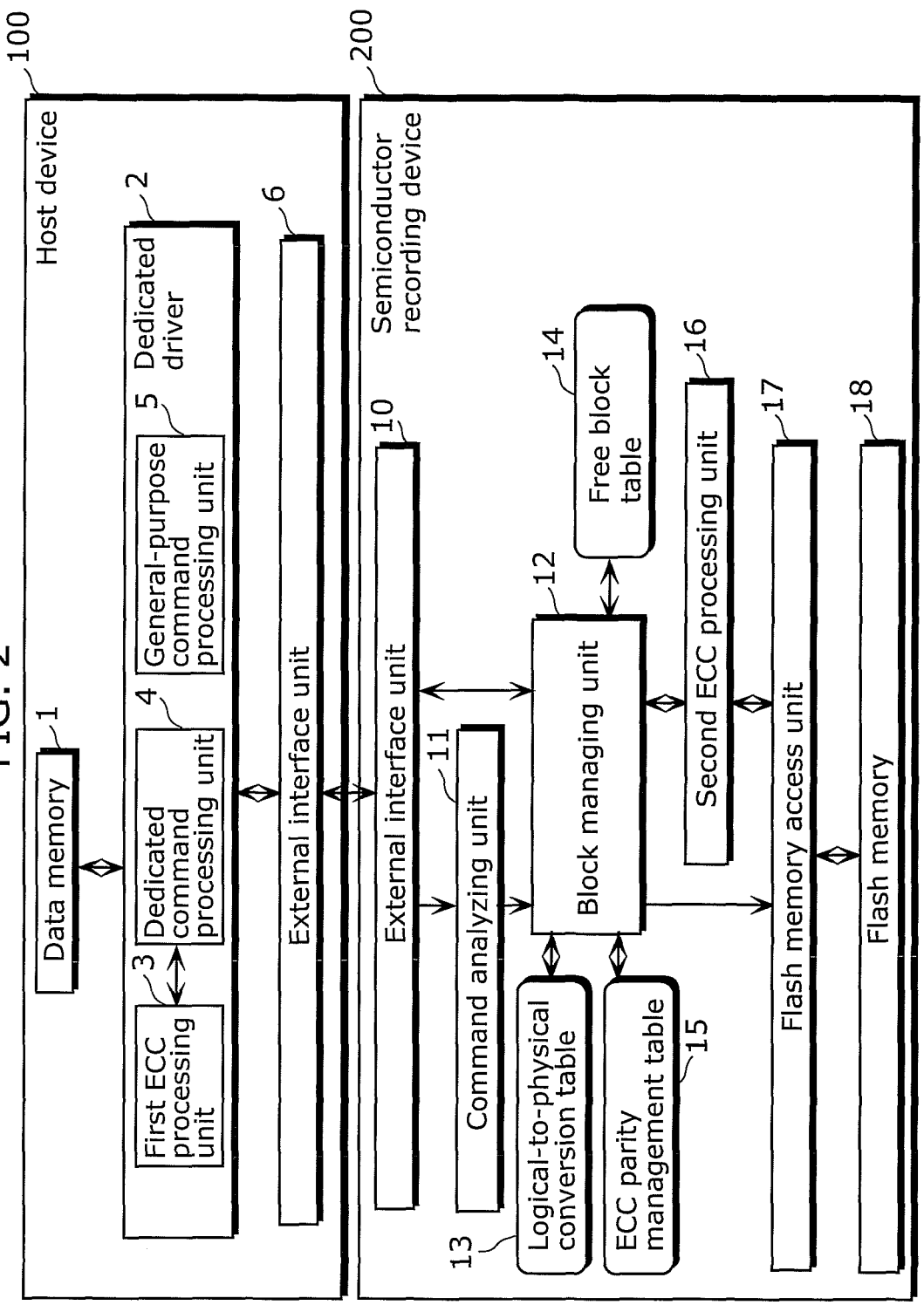
FIG. 2 is a diagram illustrating an overall structure of the semiconductor recording system according to Embodiment 1 of the present invention.

First, reference is made to a semiconductor recording device and a semiconductor recording system according to Embodiment 1, with reference FIG. 2. FIG. 2 is a diagram illustrating an overall structure of a semiconductor recording system according to Embodiment 1.

As shown in FIG. 2, the semiconductor recording system according to Embodiment 1 includes a host device 100 and a removable semiconductor recording device 200.

Hereinafter, each element of the host device 100 according to Embodiment 1 is described.

As shown in FIG. 2, the host device 100 according to Embodiment 1 includes a data memory 1, a dedicated driver 2, and an external interface unit 6.

In FIG. 2, the data memory 1 is a memory for storing user data and parity data to be written onto the semiconductor recording device 200.

The dedicated driver 2 is a driver dedicated to the semiconductor recording device 200, and includes a first ECC processing unit 3, a dedicated command processing unit 4, and a general-purpose command processing unit 5.

In the dedicated driver 2, the first ECC processing unit 3 generates a first ECC code based on the user data stored in the data memory 1. More specifically, the first ECC processing unit 3 has a function to process parity data. The first ECC processing unit generates parity data corresponding to user data and generates the first ECC code including the user data and the parity data.

The dedicated command processing unit 4 processes dedicated commands related to parity data. For example, the dedicated command processing unit 4 generates dedicated commands (dedicated write commands) for writing, onto the semiconductor recording device 200, the parity data generated by the first ECC processing unit 3, or generates dedicated commands (dedicated read commands) for reading, from the semiconductor recording device 200, the parity data stored in the semiconductor recording device 200.

The general-purpose command processing unit 5 processes general-purpose commands which are related to user data and which can be used by a general-purpose driver (not shown). Thus, in the case where the general-purpose driver is used instead of the dedicated driver 2, only the general-purpose command processing unit 5 in the dedicated driver 2 operates.

The external interface unit 6 is an interface for transmitting and receiving commands and data from and to the semiconductor recording device 200. For example, the external interface unit 6 issues write commands or read commands to the semiconductor recording device 200, or transmits and receives user data or parity data to and from the semiconductor recording device 200. More specifically, the external interface unit 6 issues, for example, write command groups (first command groups) each including user data to be recorded onto the semiconductor device 200 and a general-purpose write command, write command groups (second command groups) each including parity data to be recorded onto the semiconductor recording device 200 and dedicated write commands, or read commands for reading user data from the semiconductor recording device 200.

Next, reference is made to the elements of the semiconductor recording device 200 according to Embodiment 1.

As shown in FIG. 2, the semiconductor recording device 200 according to Embodiment 1 includes: an external interface unit 10; a command analyzing unit 11; a block managing unit 12; a logical-to-physical conversion table 13; a free block table 14; an ECC parity management table 15; a second ECC processing unit 16; a flash memory access unit 17; and a flash memory 18.

In FIG. 2, the external interface unit 10 is an interface for receiving commands, user data or parity data from the host device 100, or transmitting user data recorded on the flash memory 18.

For example, the external interface unit 10 receives, from the host device 100, write command groups each including user data to be written on the flash memory 18 and a general-purpose write command, or receives write command groups each including parity data to be written on the flash memory 18 and a dedicated write command. The external interface unit 10 also transmits the received commands to the command analyzing unit 11.

Furthermore, the external interface unit 10 receives, from the host device 100, read commands for reading user data recorded on the flash memory 18, and transmits the user data to the host device 100.

The command analyzing unit 11 receives the commands issued by the host device 100 via the external interface unit 10, and analyzes the received commands. For example, the command analyzing unit 11 analyzes a write command received from the host device 100 to identify whether the write command is a general-purpose write command or a dedicated write command.

The block managing unit 12 manages physical blocks of the flash memory 18 by using the logical-to-physical conversion table 13, the free block table 14, and the ECC parity management table 15. For example, the block managing unit 12 is a management control unit which updates management information stored in the tables, or performs various controls such as conversion, based on the write command as will be described later. The block managing unit 12 also serves as a control unit for performing other various controls described in Embodiment 1.

The logical-to-physical conversion table 13 is a table for storing management information (logical block management information) indicating correspondence between logical blocks and physical blocks of the flash memory 18. The correspondence is uniquely defined with the interface to the host device 100.

The free block table 14 is a table for storing management information (unused block management information) indicating whether or not respective physical blocks in the flash memory 18 can be newly written. The free block table 14 stores, for each physical block in the flash memory 18, "1" for an in-use block and "0" for an unused block.

The ECC parity management table 15 is a table for storing management information (data validity management information) indicating whether or not a first ECC code written in association with each logical block is valid, that is, whether or not user data and parity data corresponding to the user data is valid.

References will be later made in detail to the logical-to-physical conversion table 13, the free block table 14, and the ECC parity management table 15.

The second ECC processing unit 16 generates a second ECC code for user data and parity data and performs error correction using the second ECC code, for each page included in physical blocks of the flash memory 18.

The flash memory access unit 17 reads and writes data from and onto the flash memory 18 according to addresses indicated by the block managing unit 12.

The flash memory 18 is a non-volatile memory for storing predetermined data. In Embodiment 1, the flash memory 18 includes four flash memory chips each of which includes physical blocks each having a plurality of pages. The page refers to a minimum unit of recording data (write access unit), and the block (physical block) refers to a minimum unit of erasing, for an external device such as a host device. Each of the four flash memory chips stores user data, parity data, data of the logical-to-physical conversion table 13, and the data of the ECC parity management table 15.

The parity data is data generated by the first ECC processing unit 3 of the host device 100, and is internal data of the dedicated driver 2; and thus, in the semiconductor recording device 200, the parity data is written into an area that is not recognized by a file system of the host device 100. Accordingly, read and write of the parity data are performed only in a predetermined area of the semiconductor recording device 200 based on dedicated commands issued by the dedicated driver 2. On the other hand, write and read of the user data are performed in the areas recognized by the file system of the host device 100, based on the general-purpose commands.

Figure 3:
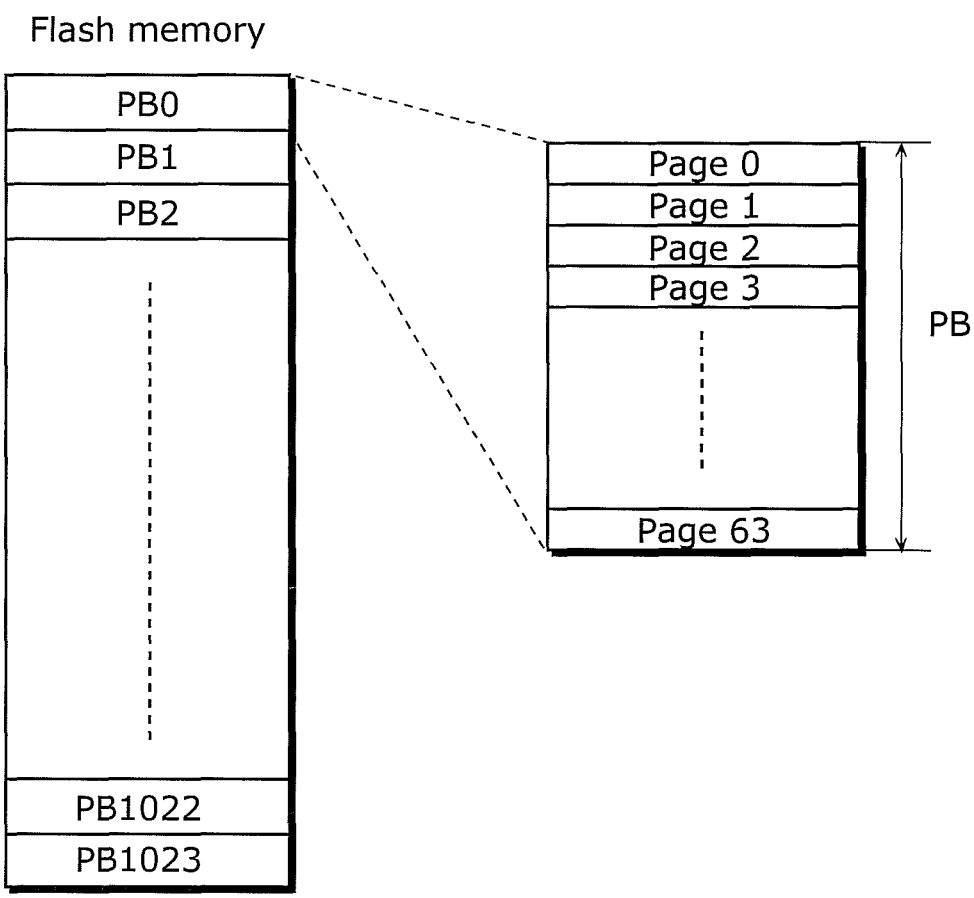
FIG. 3 is a diagram illustrating an internal structure of a flush memory in the semiconductor recording device according to Embodiment 1 of the present invention.

Here, reference is made to an internal structure of the flash memory 18 used in Embodiment 1, with reference to FIG. 3. FIG. 3 is a diagram illustrating an internal structure of the flush memory 18 in the semiconductor recording device 200 according to Embodiment 1.

In FIG. 3, "PB" refers to a physical block, and "PB0" refers to a physical block having a block address of "0". In the similar manner, "PB1" refers to a physical block having a block address of "1", and "PB1023" refers to a physical block having a block address of "1023".

As shown in FIG. 3, each physical block of the flash memory 18 includes a plurality of pages. For example, "page 0" refers to a page having a page number of "0", and "page 1" refers to a page having a page number of "1". In Embodiment 1, a single physical block PB includes sixty-four pages from page 0 to page 63.

It is assumed here that data having a size of 4 KB is written into a page of the flash memory 18. Since one physical block includes sixty-four pages, each block can store data of 256 KB (4 KB×64). Furthermore, since one flash memory includes 1024 physical blocks, one flash memory can store data of 256 MB. In Embodiment 1, the flash memory 18 includes four flash memory chips; and thus, there are 4096 physical blocks.

Next, reference is made to the assignment of various kinds of data to the 4096 physical blocks. In Embodiment 1, the first ECC processing unit 3 generates parity data of 1 byte for user data of 4 bytes. In other words, the ratio of the user data and the parity data to be written onto the flash memory 18 is 4:1. Of the 4096 physical blocks of the flash memory 18, 3200 physical blocks are assigned to the physical blocks (user data physical blocks) for storing user data, 800 physical blocks are assigned to the physical blocks (parity data physical blocks) for storing parity data, and the remaining 96 physical blocks are assigned to physical blocks or alternative blocks for storing system data such as the logical-to-physical conversion table. In the case where physical blocks (post-fabrication defective block) occur which became defective after fabrication, the post-fabrication defective blocks are registered as defective blocks so that use of these physical blocks are prohibited, and the alternative blocks are used instead.

Figure 4:
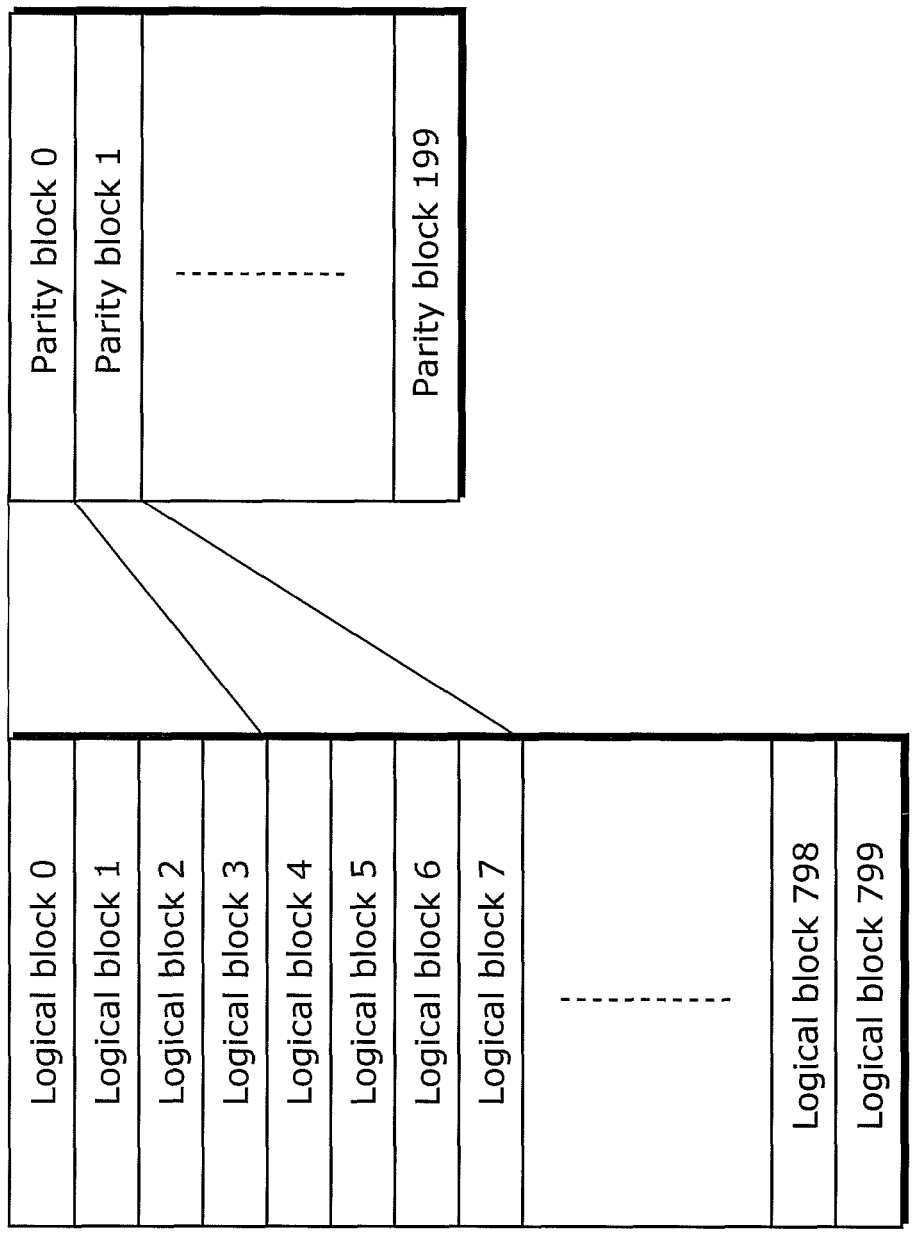
FIG. 4 is a conceptual diagram illustrating relationship between logical blocks and parity blocks in the semiconductor system according to Embodiment 1 of the present invention.

Next, reference is made to logical blocks and parity blocks, with reference to FIG. 4. FIG. 4 is a conceptual diagram illustrating relationship between logical blocks and parity blocks in the semiconductor recording system according to Embodiment 1. The respective logical blocks store user data. The respective parity blocks store parity data generated from user data for the four sequentially-numbered logical blocks. In FIG. 4, the parity block is a block that cannot be recognized by a file system, and is an area predetermined only between the dedicated driver 2 and the semiconductor recording device 200.

The size of each logical block is 1 MB which corresponds to sequential 2048 sectors (one sector equals to 512 B). The logical blocks are sequentially numbered from 0 to 799. The following equation 1 represents correspondence between a logical block number and a sector number.

(Logical block number)=(Sector number)/2048 (Equation 1)

The size of each parity block is 1 MB that is the same as the size of the logical block. The parity blocks are sequentially numbered from 0 to 199. The flowing Equation 2 represents the parity block number that is associated with the logical block.

(Related parity block number)=(Logical block number)/4 (Equation 2)

Each of the logical block and the parity block includes 64 logical pages. The size of each logical page is 16 KB (=1 MB/64). Each logical page is sequentially numbered from 0 to 63.

The following Equation 3 represents the relationship between a sector number and a logical page number of a logical block.

(Logical page number of logical block)=((sector number) % 2048)/32 (Equation 3)

In Equation 3, "%" represents an operator for obtaining a residue (a remainder of division). The same also applies to the following.

The following Equation 4 represents the relationship between a sector number and a logical page number of a parity block related to the sector.

(Logical page number of related parity block)=((sector number) % 8192)/128 (Equation 4)

Next, reference is made to an extended block and an extended page.

Each extended block includes four physical blocks each of which is extracted from respective four flash memories (flash memory 0 to flash memory 3). The size of one physical block is 256 KB; and thus, the size of the extended block is 1 MB. Here, it is not necessary that the block numbers of the four physical blocks in the extended block are the same. It is preferable that the four physical block numbers are extracted at random because the number of writing of each physical block can be averaged.

The extended page refers to a page in which the same numbered pages of four physical blocks in an extended block are combined. The size of one page of the physical block is 4 KB; and thus, the size of the extended page is 16 KB. Since the physical block includes 64 pages, the extended block also includes 64 extended pages.

Next, reference is made to the logical-to-physical conversion table 13.

The logical-to-physical conversion table 13 includes: a table for storing management information (first logical block management information) indicating correspondence between logical blocks and extended blocks; and a table for storing management information (second logical block management information) indicating correspondence between parity blocks and extended blocks. As described, the extended block includes four physical blocks each of which is extracted from the respective four flash memories. Accordingly, logical block numbers, parity block numbers and the corresponding four physical block numbers are associated with one another in the table.

FIG. 5A and FIG. 5B each illustrates an example of the logical-to-physical conversion table 13. FIG. 5A illustrates an example of the logical-to-physical conversion table for the logical blocks in the semiconductor recording device 200 according to Embodiment 1. FIG. 5B illustrates an example of the logical-to-physical conversion table for the parity blocks in the semiconductor recording device 200.

As shown in FIG. 5A, the logical-to-physical conversion table 13 for the logical blocks is a correspondence table between each logical block number and physical block numbers assigned to the respective logical blocks, and stores four physical block numbers corresponding to respective 800 logical blocks numbered from 0 to 799. In such a manner, the physical blocks of the flash memory 18 are managed.

As shown in FIG. 5B, the logical-to-physical conversion table 13 for the parity blocks is a correspondence table between each parity block number and the physical block numbers assigned to the respective parity blocks, and stores physical block numbers corresponding to respective 200 parity blocks numbered from 0 to 199. In such a manner, the physical blocks of the flash memory 18 are managed.

In the following, reference is made in detail to the assignment of the logical blocks or the parity blocks and the physical blocks.

As shown in FIG. 5A, four physical blocks are assigned with the same logical block number. Each of the four physical blocks corresponds to a different block of the four respective flash memories (flash memories 0 to 3). In FIG. 5A, the codes "0-0", "1-300", "2-600", and "3-900" that are indicated as the physical block numbers respectively refer to the physical block numbered 0 in the flash memory 0, the physical block numbered 300 in the flash memory 1, the physical block numbered 600 in the flash memory 2, and the physical block numbered 900 in the flash memory 3. Furthermore, the codes "0-1024", "1-1024", "2-1024", and "3-1024" indicate the physical block numbered 1024 in each flash memory. However, the valid physical block numbers in each flash memory are 0 to 1023; and thus, the code "1024" indicating the number 1024 represents that no physical block is assigned to the corresponding logical block, or the logical block has been written, but not in an in-use state. More specifically, the physical blocks assigned with the physical block number of 1024 are unused blocks. The same also applies to the example in FIG. 5B.

More specifically, for example, as shown in FIG. 5A, the logical block having a logical block number of 0 is assigned with four physical blocks numbered "0-0", "1-300", "2-600", and "3-900". The logical block numbered 1 is assigned with four physical blocks numbered "0-100", "1-400", "2-700", and "3-1000". The logical block numbered 2 is assigned with four physical blocks numbered "0-200, "1-500", "2-800", and "3-0". The logical block numbered 3 is assigned with four physical blocks numbered "0-300", "1-600", "2-900" and "3-100". The logical block having the logical block number of 799 indicates that no physical block is assigned.

In the similar manner, as shown in FIG. 5B, the parity block having a parity block number of 0 is assigned with four physical blocks numbered "0-400", "1-700", "2-1000", and "3-200". The parity blocks numbered 1 and 199 indicate that no physical block is assigned.

The logical-to-physical conversion tables 13 shown in FIG. 5A and FIG. 5B are updated each time the logical blocks are overwritten in the write process. The update is performed by the block managing unit 12. The logical-to-physical conversion tables 13 may be updated in the following manner. The block managing unit 12 generates a new logical block by extracting, from each flash memory, one unused physical block assigned with the physical block number of 1024 in the logical-to-physical conversion table 13, writes user data onto the unused physical blocks corresponding to the new logical block, and then updates the logical-to-physical conversion table 13 such that the numbers of written physical blocks correspond to the new logical block number. At this time, physical blocks used before are updated so as to be unused blocks, and the physical blocks in the logical-to-physical conversion table 13 are assigned with the number of 1024. Of all the physical blocks of the flash memory 18, the physical blocks other than valid physical blocks (physical blocks stored in the logical-to-physical conversion table 13 as being in in-use states) are unused blocks.

The extraction of unused blocks may be performed each time data is written. In Embodiment 1, unused blocks are extracted by creating the free block table 14 (described later) at the time of power-on and managing the free block table 14.

Next, reference is made to the free block table 14.

As previously described, the free block table 14 is a table for storing management information (unused block management information) indicating whether or not each of physical blocks in the flash memory 18 is newly writable. In the free block table 14, "1" that indicates in-use state is stored for the valid physical blocks stored in the logical-to-physical conversion table 13 as being in-use states and for defective physical blocks determined as being unusable, and "0" is stored for physical blocks on which data has not yet been written and physical blocks on which data was written but which are now in unused-states.

More specifically, the block managing unit 12 creates the free block table 14 by reading, at the time of power-on, a defective physical block table having a list of the logical-to-physical conversion table 13 and defective physical blocks. The block managing unit 12 updates the free block table 14 in synchronization with the update of the logical-to-physical conversion table 13. By doing so, the extraction of the unused blocks can be accelerated.

Next, reference is made to the ECC parity management table 15.

The ECC parity management table 15 is a table for storing management information (data validity management information) indicating whether or not the first ECC code, that is, user data and the corresponding parity data are valid. The first ECC code here is generated by the first ECC processing unit 3 and written onto the flash memory 18 of the semiconductor recording device 200. The validity of the user data and the parity data are managed for each logical block.

FIG. 6 illustrates an example of the ECC parity management table 15. FIG. 6 is a diagram illustrating an example of the ECC parity management table in the semiconductor recording device 200 according to Embodiment 1.

As shown in FIG. 6, the ECC parity management table 15 holds flags (management information) indicating validity of user data and parity data for the corresponding respective 800 logical blocks having the logical block numbers of 0 to 799. In the ECC parity management table 15, "1" is stored if the user data and the parity data for the corresponding logical block is valid, and "0" is stored if invalid.

For example, in FIG. 6, "1" is stored for the cells indicating the validity of the user data and the parity data corresponding to the logical blocks having the logical block numbers of 0 to 2; and thus, it is indicated that both the user data and the parity data are valid. In the similar manner, it is indicated that only the user data is valid for the logical block numbered 3, and both the user data and the parity data are invalid for the other logical blocks.

In the ECC parity management table 15, at the time of formatting of the semiconductor recording device 200, both the user data and the parity data for all the logical blocks are set to be invalid so that "0" is stored in all the cells. At the start of writing of the user data for a logical block, the block managing unit 12 updates the management information such that both of the user data and its corresponding parity data stored in the flash memory 18 are set to be invalid. Furthermore, at the end of the writing of the user data for a logical block, the management information is updated so that the stored user data is set to be valid. At the time of completion of the writing of both the user data and the parity data for the logical block, the management information is updated so that the stored parity data is set to be valid.

References have been made to the elements of the memory control according to Embodiment 1, which are the logical blocks, the parity blocks, the logical pages, the extended blocks, the extended pages, the logical-to-physical conversion table, the free block table, and the ECC parity management table.

Figure 7:
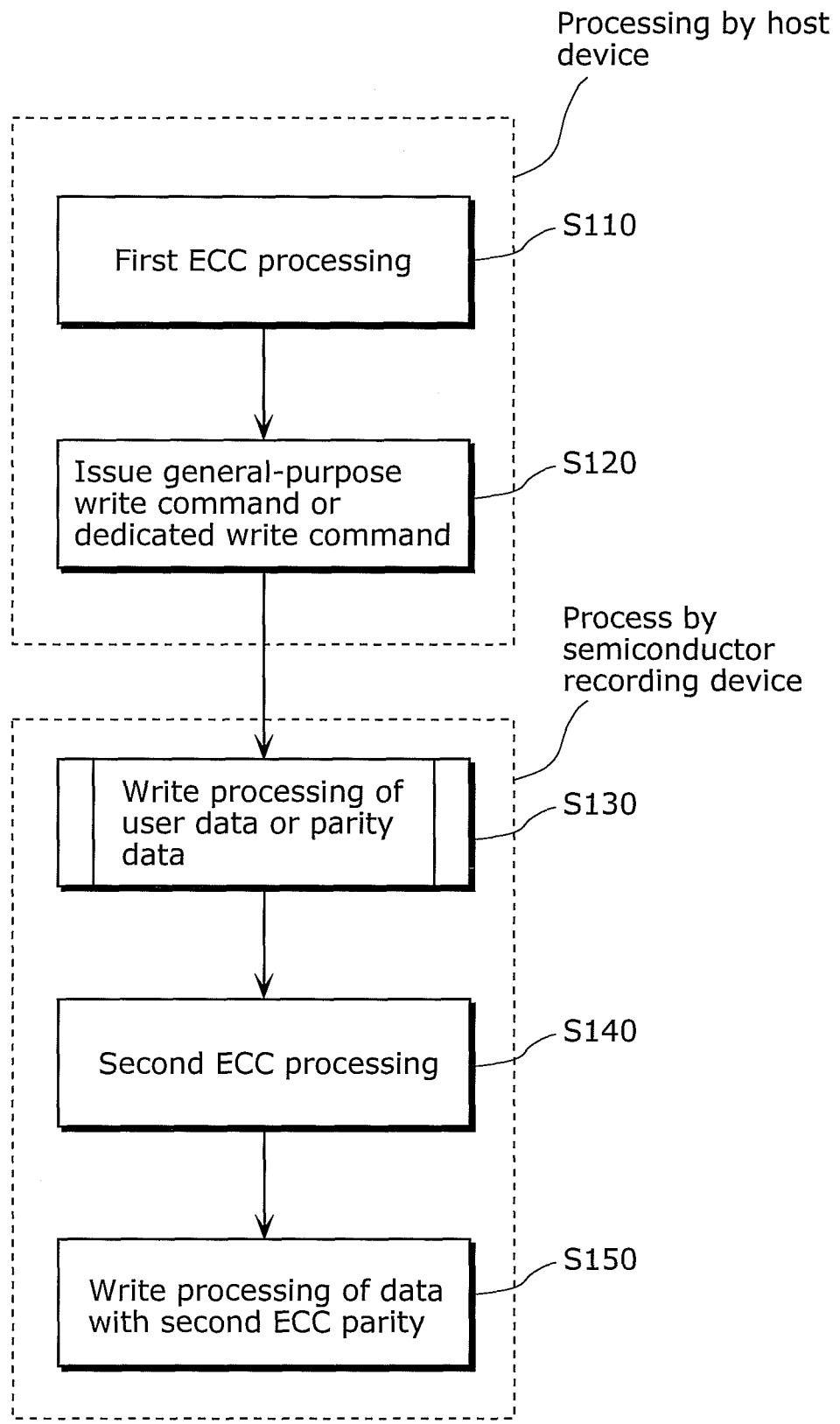
FIG. 7 is a flowchart of a write operation in the semiconductor recording system according to Embodiment 1 of the present invention.

Hereinafter, reference is made in detail to the write operation in the semiconductor recording system according to Embodiment 1, with reference to FIG. 2 and FIG. 7. FIG. 7 is a flowchart of a write operation in the semiconductor recording system according to Embodiment 1.

In the semiconductor recording system according to Embodiment 1, write commands, sector numbers of the write targets, user data corresponding to the sector numbers, and the parity data associated with the user data are transferred from the external interface unit 6 of the host device 100 to the external interface unit 10 of the semiconductor recording device 200. In the following, for ease of the description, the alignment of data to be written onto the semiconductor recording device 200 is assumed to be 1 MB that is a unit of the logical block.

First, reference is made in detail to the operation of the host device 100.

As shown in FIG. 7, first the host device 100 performs first ECC processing (S110).

Here, user data, which is a write target, accumulated in the data memory 1 is provided to the first ECC processing unit 3.

More specifically, the first ECC processing unit 3 reads the user data stored in the data memory 1 by 1 byte at the interval of 4 KB, and generates parity data of 1 byte by performing an EXOR operation on the user data having a total of 4 bytes. The generated parity data is stored in a predetermined area of the data memory 1. The size of one logical page in the flash memory 18 of the semiconductor recording device 200 is 16 KB; and thus, when parity data is sequentially generated, the first ECC processing unit 3 generates parity data of 4 KB per one logical page. Therefore, the first ECC processing unit 3 generates the parity data of 256 KB of 64 pages for one logical block.

As described, by generating parity data of 1 byte based on user data of total 4 bytes obtained by extracting four sets of 1-byte user data in a unit of 4 KB, one logical page of 16 KB consists of four physical blocks each in 4 KB. Accordingly, a symbol (identification code for identifying each first ECC code) of 1 byte included in the first ECC code is written to different physical blocks. This enhances error resilience against post-fabrication defect of physical blocks and deterioration in the data holding characteristics.

When the first ECC code is generated, as shown in FIG. 7, the host device 100 issues, to the semiconductor recording device 200, general-purpose write commands related to the user data or dedicated write commands related to the parity data (S120).

The general-purpose write commands are write commands corresponding to the user data stored in the data memory 1. The general-purpose write commands are generated by the general-purpose command processing unit 5 adding initial logical sector numbers of the user data to be written, the number of sectors to be written, and the memory addresses of the host device 100 which stores the user data to be written. The general-purpose write commands are issued to the semiconductor recording device 200 via the external interface unit 6.

The dedicated write commands are write commands corresponding to the parity data stored in the data memory 1. The dedicated write command is generated by the dedicated command processing unit 4 adding a predetermined parity block number, the logical page number, and the memory address of the host device 100 which stores the parity data to be written. The general-purpose write commands are issued to the semiconductor recording device 200 via the external interface unit 6.

The parity data for one logical block corresponds to sequential sixteen logical pages of one parity block; and thus, if the dedicated driver 2 issues a dedicated write command of 16 KB sixteen times, the dedicated driver 2 can write parity data for one logical block.

In Embodiment 1, the write operation of the user data and the write operation of the parity data related to the user data are sequentially performed. However, it is preferable that in view of the later described removal of the semiconductor recording device 200, the write operation of the parity data associated with user data is performed after the write operation of the user data.

Next, reference is made in detail to the operation of the semiconductor recording device 200. In other words, reference is made to a control method of the semiconductor recording device according to Embodiment 1.

As shown in FIG. 7, the semiconductor recording device 200 performs a write operation of the user data or the parity data, upon receipt of a write command from the host device 100 (S130). Details of the write operation will be described later.

After that, in the semiconductor recording device 200, the second ECC processing unit 16 performs second ECC processing (S140). The second ECC processing unit 16 is independently provided to each of the four flash memories. In view of that an access unit from the host device is a sector (=512 bytes), the second ECC processing unit 16 divides input data of 4K bytes into eight, and generates a Reed-Solomon code in which parity of 16 bytes is added to the respective divided data of 512 bytes. With such a structure, it is possible to correct an error of maximum of 8 bytes per 512 bytes.

Next, in the semiconductor recording device 200, the flash memory access unit 17 writes data with the second ECC parity (S150). The flash memory access unit 17 is provided independently to each of the four flash memories. Each of the flash memory access units 17 issues commands related to the address of the flash memory or for writing, and writes, onto the flash memory, data with the second ECC parity generated by the second ECC processing unit 16.

With this, the write operation of the semiconductor recording system according to Embodiment 1 ends.

Figure 8:
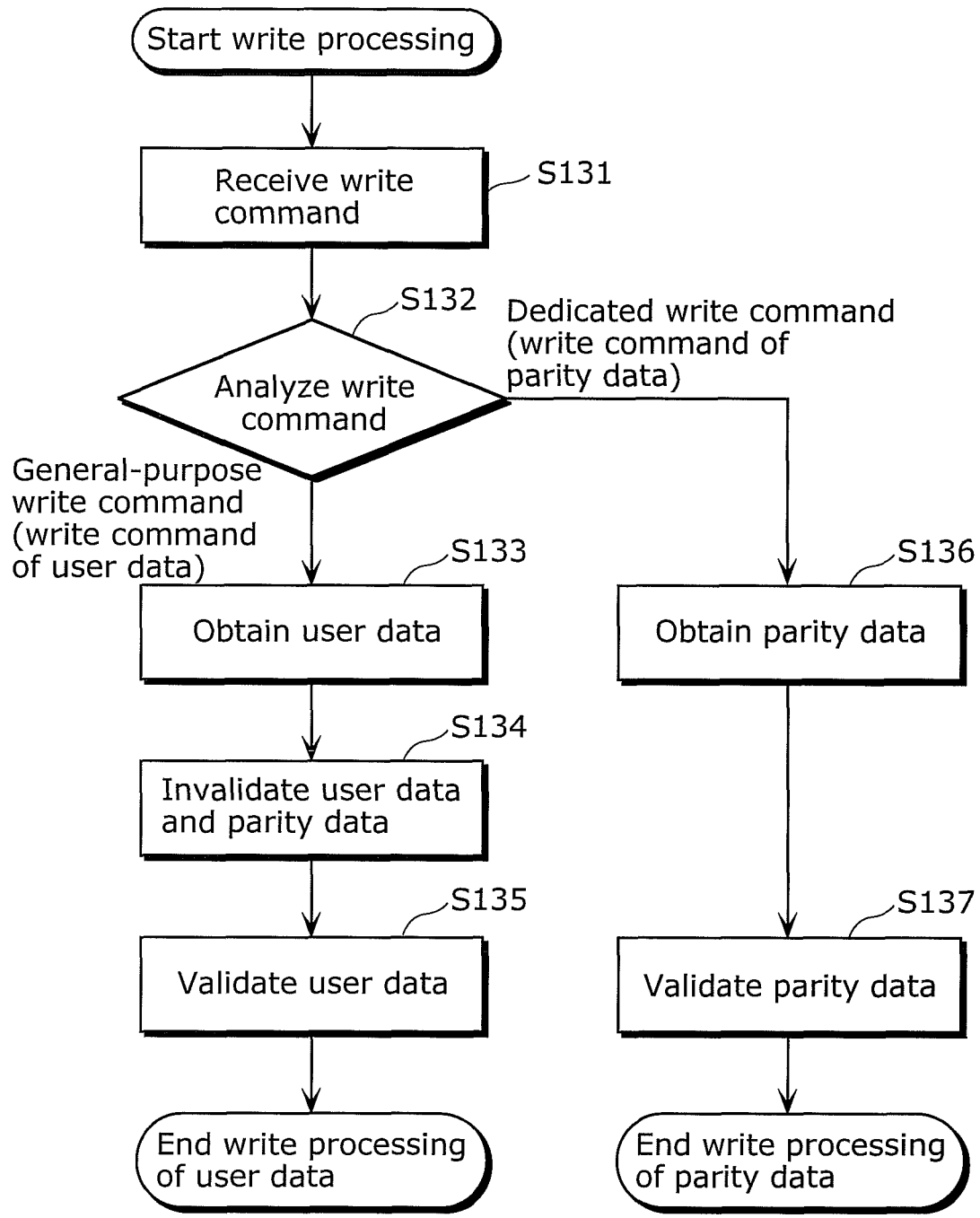
FIG. 8 is a flowchart of a write operation of user data or parity data performed by the semiconductor recording device in the semiconductor recording system according to Embodiment 1 of the present invention.

Here, reference is made in detail to the write operation (S130) of the user data or the parity data by the semiconductor recording device 200 shown in FIG. 7, with reference to FIG. 8. FIG. 8 is a flowchart of the write operation of the user data or the parity data performed by the semiconductor recording device 200 in the semiconductor recording system 200 according to Embodiment 1 of the present invention.

As shown in FIG. 8, the semiconductor recording device 200 receives write commands from the host device 100 through the external interface unit 10 (S131).

Next, the write commands received through the external interface unit 10 are analyzed by the command analyzing unit 11 (S132). The command analyzing unit 11 identifies whether the write command received from the host device 100 is a general-purpose write command related to the user data, or is a dedicated write command related to the parity data. In the case where the write command is a general-purpose command, the write command is recognized as a general-purpose write command. On the other hand, in the case where the write command from the host device 100 is a dedicated command, the write command is recognized as a dedicated command.

In the case where the write command is a general-purpose write command, the semiconductor recording device 200 obtains user data by reading the user data stored in the memory address of the host device from the data memory 1 of the host device (S133).

Here, in order to associate, based on the general-purpose write command obtained by the command analyzing unit 11, the address of the write data in the write command with the address of the memory area to which data is written, the block managing unit 12 converts the initial logical sector number and the number of sectors included in the general-purpose write command into address information of the flash memory 18. Accordingly, the obtained use data is assigned to the memory areas corresponding to predetermined addresses of the four flash memories.

In Embodiment 1, the user data of 16 KB and the four flash memories 18 are associated in the following manner. In the case of (sector number % 32)/4=0, the user data is written onto the flash memory 0. In the case of (sector number % 32)/4=1, the user data is written onto the flash memory 1. In the case of (sector number % 32)/4=2, the user data is written onto the flash memory 2. In the case of (sector number % 32)/4=3, the user data is written onto the flash memory 3.

Furthermore, the block managing unit 12 converts the logical sector number into the logical block number and the logical page number of the semiconductor recording device 200, in accordance with Equation 1 and Equation 3. With reference to the free block table 14, the block managing unit 12 obtains the physical block number and the page number of the respective flash memories to which user data is written, and stores, in the logical-to-physical conversion table 13, correspondence between the logical block number and the logical page number of a write target and the obtained physical block number and the page number of each flash memory.

In the above operation, when a logical page number and a page number of the physical block are defined as the same number, it is sufficient that the data stored in the logical-to-physical conversion table 13 include only correspondence between the logical block number and the physical block number of each flash memory.

Furthermore, the block managing unit 12 controls the ECC parity management table 15. More specifically, at the time of start of writing of user data onto the flash memory 18, the block managing unit 12 once updates the management information of the ECC parity management table 15 so as to indicate that both the user data of the logical block of the write command and the parity data corresponding to the user data are invalid (S134).

In other words, as described with reference to FIG. 6, in the cell indicating the validity of the user data and the parity data corresponding to the logical block number of the write command, "0" is stored as the management information (flag) indicating that data are invalid, or the management information is updated so as to be "0".

Subsequently, at least at the time of end of the writing of the user data, the management information in the ECC parity management table 15 is updated so as to indicate that only the user data of the logical block of the write command is valid (S135).

More specifically, the management information (flag) is updated such that the user data once invalidated at the time of start of writing is set to be valid.

In Embodiment 1, the update of the logical-to-physical conversion table 13 is performed at the time of end of the writing of the user data. In the case where it is indicated that user data is invalid in the ECC parity management table 15 and a valid physical block number is stored in the logical-to-physical conversion table 13, it is considered that removal or the like of the semiconductor recording device 200 occurred during the writing of the user data. In this case, it is sufficient that the block managing unit 12 reads data written to the physical block in the logical-to-physical conversion table 13 before writing.

Next, reference is made to a case where, in the write command analysis (S132) shown in FIG. 8, the write command from the host device 100 is recognized as a dedicated write command.

In this case, the semiconductor recording device 200 obtains parity data by reading, from the data memory 1 of the host device 100, data of the memory address of the host device 100 which stores the parity data (S136).

At this time, the block managing unit 12 converts, into address information of the flash memory 18, the parity block number and the logical page number of the dedicated write command obtained by the command analyzing unit 11. As previously described, parity data of 1 byte is generated from user data of 4 bytes; and thus, parity data corresponding to user data of four logical pages are written into one logical page.

In Embodiment 1, parity data of 256 KB corresponding to one logical block is written; and thus, it is sufficient to issue a parity write command of one logical page (=16 KB) sixty-four times. In the case of writing parity data of less than 16 KB, the host device 100 reads parity data of the corresponding logical page based on a dedicated read command, and then the updated section is written so that the parity data is written.

The parity block number and the logical page number are converted into the address information of the flash memory 18 in the following manner similar to the general-purpose write command: the block managing unit 12 obtains the physical block number and the page number of each flash memory to which parity data is written, with reference to the free block table 14; and stores, in the logical-to-physical conversion table 13, correspondence between the parity block number and the logical page number of the write target and the obtained physical block number and the page number of each flash memory.

In the above operation, when a logical page number and a page number of the physical block are defined as the same number, it is sufficient that the data stored in the logical-to-physical conversion table 13 includes only correspondence between the parity block number and the physical block number of each flash memory.

Furthermore, the block managing unit 12 controls the ECC parity management table 15. More specifically, at the time of end of the writing of all the parity data associated with one logical block, the block managing unit 12 updates the management information of the ECC parity management table 15 so as to indicate that the parity data of the logical block related to the parity data is valid (S137).

With this, the write operation of the parity data ends; however, it is necessary that the write operation of the user data of one logical block and the write operation of the parity data related to the logical block are performed in accordance with the following two rules. The write order of the user data and the parity data can be controlled by the block managing unit 12.

(Rule 1) Parity data associated with a logical block should not be written before starting writing of user data to the logical block. More specifically, the host device 100 transmits a dedicated write command related to parity data after transmitting a general-purpose write command related to user data, and the semiconductor recording device 200 writes the parity data after writing the user data onto the flash memory 18.

(Rule 2) Before ending writing of all parity data associated with one logical block, writing of all user data of the corresponding logical blocks ends. More specifically, the host device 100 transmits a general-purpose write command, starts transmitting a dedicated write command after the completion of writing of all user data of the corresponding logical blocks, and then writes all parity data related to one logical block.

These two rules are effective in the case where the removal semiconductor recording device 200 is removed during writing, or in the case where user data written by a dedicated driver is overwritten by a general-purpose driver. In the following, references are made to these two cases.

First, reference is made to the case where the removable semiconductor recording device 200 is removed during the writing. In this case, the timing with which the semiconductor recording device 200 is removed during the writing is classified into the following four cases.

(T1) In the middle of writing user data in the semiconductor recording device 200

(T2) In the middle of writing parity data in the semiconductor recording device 200

(T3) After completion of writing of user data, and before starting writing of parity data related to the user data, in the semiconductor recording device 200

(T4) timing other than (T1) to (T3)

Reference is made in detail to the "validity of user data" and the "validity of parity data" in the ECC parity management table 15 at the above four removal timings.

In the case where the semiconductor recording device 200 is removed at the timing of (T1), both the "validity of user data" and the "validity of parity data" are invalid because both the "validity of user data" and the "validity of parity data" were updated to be invalid at the start of writing of user data. However, the logical-to-physical conversion table 13 is updated at the time of end of the writing of the user data; and thus, the user data and the parity data written to the physical block in the pre-updated logical-to-physical conversion table 13 are valid.

In the case where the semiconductor recording device 200 is removed at the timing of (T2), the "validity of user data" is valid and the "validity of parity data" is invalid in the ECC parity management table 15. Accordingly, in this case, only the updated user data is used and the parity data is not used.

In the case where the semiconductor recording device 200 is removed at the timing of (T3), the "validity of user data" is valid and the "validity of parity data" is invalid in the ECC parity management table 15. Accordingly, in this case, too, only the updated user data is used and the parity data is not used.

At the timing of (T4), a sequence of writing does not occur; and thus, problems do not occur.

In such a manner, by updating both the "validity of user data" and the "validity of parity data" in the ECC parity management table 15 to be invalid at the time of start of writing of user data, it is possible to detect inconsistency between user data and parity data generated by the removal of the semiconductor recording device 200 when the user data has been updated but the corresponding parity data has not been updated. Therefore, in the case where an error occurs in reading the user data, use of the parity data can be prohibited, thereby preventing false correction generated by use of unrelated parity data. The detection of the inconsistency between the user data and the parity data can be performed by a control unit in the semiconductor recording device 200, such as the block management unit 12.

Next, reference is made to the case where user data written by the dedicated driver 2 is overwritten by a general-purpose driver.

The write area of the parity data in Embodiment 1 is an area accessible only by the dedicated driver 2, and not accessible by the general-purpose driver. Therefore, in the case of using the general-purpose driver, a write command of the parity data cannot be used.

The "validity of user data" and the "validity of parity data", in the ECC parity management table 15, of the block written by the dedicated driver 2 are both in valid states. In the case where only a write command of the user data is performed by the general-purpose in this state, both the "validity of user data" and the "validity of parity data" of the ECC parity management table 15 are invalid at the time of start of the write command of the user data. After completion of the write command of the user data, only the "validity of user data" is valid, and the "validity of parity data" remains invalid in the ECC parity management table 15. Thus, it can be determined that there is no relevance between user data and the parity data; and thus, in the case where an error occurs in reading the user data, the use of the parity data can be prohibited. Accordingly, it is possible to prevent false correction generated by the use of the unrelated parity data. The determination of the relevance between the user data and the parity data can be performed by a control unit in the semiconductor recording device 200, such as the block management unit 12.

Next, reference is made to the operation at the time of reading in the semiconductor recording system according to Embodiment 1, in the case where the host device 100 is provided with a general-purpose driver and in the case where the host device 100 is provided with a dedicated driver.

First, reference is made to the case where the host device 100 is provided with a general-purpose driver.

In this case, the read command received via the external interface unit 10 is analyzed by the command analyzing unit 11, and recognized as a general-purpose read command.

Here, the block managing unit 12 converts, into the address information of the flash memory 18, the initial logical sector number and the number of read sectors of the read command of the user data obtained by the general-purpose read command, with reference to the logical-to-physical conversion table 13.

The flash memory access unit 17 then issues a read command to the flash memory 18 based on the converted address, so that the user data is read from the flash memory 18. The user data read from the flash memory 18 is provided to the second ECC processing unit 16. The second ECC processing unit 16 performs an error correction per page of the flash memory 18. In the case where an error could be corrected, the block managing unit 12 transfers the error-corrected user data to a predetermined address of the data memory 1 of the host device 100 via the external interface unit 10. On the other hand, in the case where the error could not be corrected, the block managing unit 12 notifies the host device 100 via the external interface unit 10 that the error could not be corrected.

Next, reference is made to the case where the host device 100 is provided with the general-purpose driver 2. The operation in the case where the error could be corrected by the second ECC processing unit 16 is the same as the operation in the case where the host device 100 is provided with the general-purpose driver; and thus, the description is not repeated.

The operation in the case where the error could not be corrected by the second ECC processing unit 16 is performed by the following steps (S1) to (S9).

(S1) First, the semiconductor recording device 200 notifies the host device 100 via the external interface unit 10 that the error could not be corrected and the logical sector number in which the error occurred.

(S2) Next, the dedicated driver 2 of the host device 100 calculates the parity block number and the logical page number of the logical sector number which has the error, by using the dedicated command processing unit 4.

(S3) Subsequently, the dedicated command processing unit 4 issues, to the semiconductor recording device 200 via the external interface unit 6, a dedicated read command related to the parity block number and the logical page number of the logical sector number which has the error.

(S4) The semiconductor recording device 200 receives the dedicated read command from the host device 100 via the external interface unit 10. The command analyzing unit 11 determines that the received dedicated read command is a read command of the parity data.

(S5) Then, the block managing unit 12 converts the parity block number and the logical page number into the address of the flash memory 18 with reference to the logical-to-physical conversion table 13.

(S6) Furthermore, the block managing unit 12 checks validity of the parity data corresponding to the logical block, with reference to the ECC parity management table 15.

(S7) In the case where the block managing unit 12 determines that the parity data corresponding to the logical block is invalid, the host device 100 is notified that the parity data cannot be used, and the sequence ends. On the other hand, in the case where determined that the parity data corresponding to the logical block is valid, the flash memory access unit 17 issues a read command so that the parity data is read from the flash memory 18.

(S8) After that, the read parity data is error-corrected by the second ECC processing unit 16. Here, in the case where the error cannot be corrected, the host device 100 is notified that the error cannot be corrected, and the sequence ends. On the other hand, in the case where the error can be corrected, the block managing unit 12 transfers the error-corrected parity data to a predetermined address of the data memory 1 of the host device 100 via the external interface unit 10.

(S9) The host device 100 causes the first ECC processing unit 3 to perform, using the parity data, the error correction of the user data which had a read error.

In such a manner, in the case where the host device 100 is provided with the dedicated driver 2, the first ECC parity generated by the dedicated driver 2 is written onto the semiconductor recording device 200. The ECC parity management table 15 manages the validity of the parity data of the written user data. In the case where an error occurs in reading user data, it can be determined by the ECC parity management table 15 whether or not the error can be corrected by using the parity data; and thus, it is possible to detect inconsistency between user data and parity data generated by a removal of the semiconductor recording device 200 during writing or overwriting of the user data by a general-purpose driver. Thus, in the case where an error occurs in reading user data, use of the parity data which is inconsistent with the user data can be prohibited, thereby preventing false correction caused by use of the parity data which is inconsistent with the user data.

In Embodiment 1, the memory included in the semiconductor recording device 200 has been described as a flash memory; however, of course, any non-volatile memories can provide the same advantageous effects.

In Embodiment 1, the parity of the first ECC code is simple parity; however, of course, use of parity of several bytes enhances error correction capability.

In Embodiment 1, the number of symbols of the first ECC code is five including parity; however, the present invention is not limited to the example.

In Embodiment 1, the processing of the first ECC code is performed by a driver, but may be performed by a hardware of the host device 100.

In Embodiment 1, the ECC parity management table 15 manages validity of parity data per logical block; however, may manage the validity of parity data per logical page. In this case, the management may be performed by providing a marker of 2 bits indicating "likely to be updated" and "update completed" for determining validity of parity data, per logical page of a parity block. The "likely to be updated" may be set at the start of writing of user data, and "update completed" may be set at the completion of writing of parity data. In the case where an error occurs in user data, the same advantageous effects can be obtained by performing an error correction after validating parity data only based on a combination pattern of "likely to be updated" and the "update completed".

Embodiment 2

Figure 9:
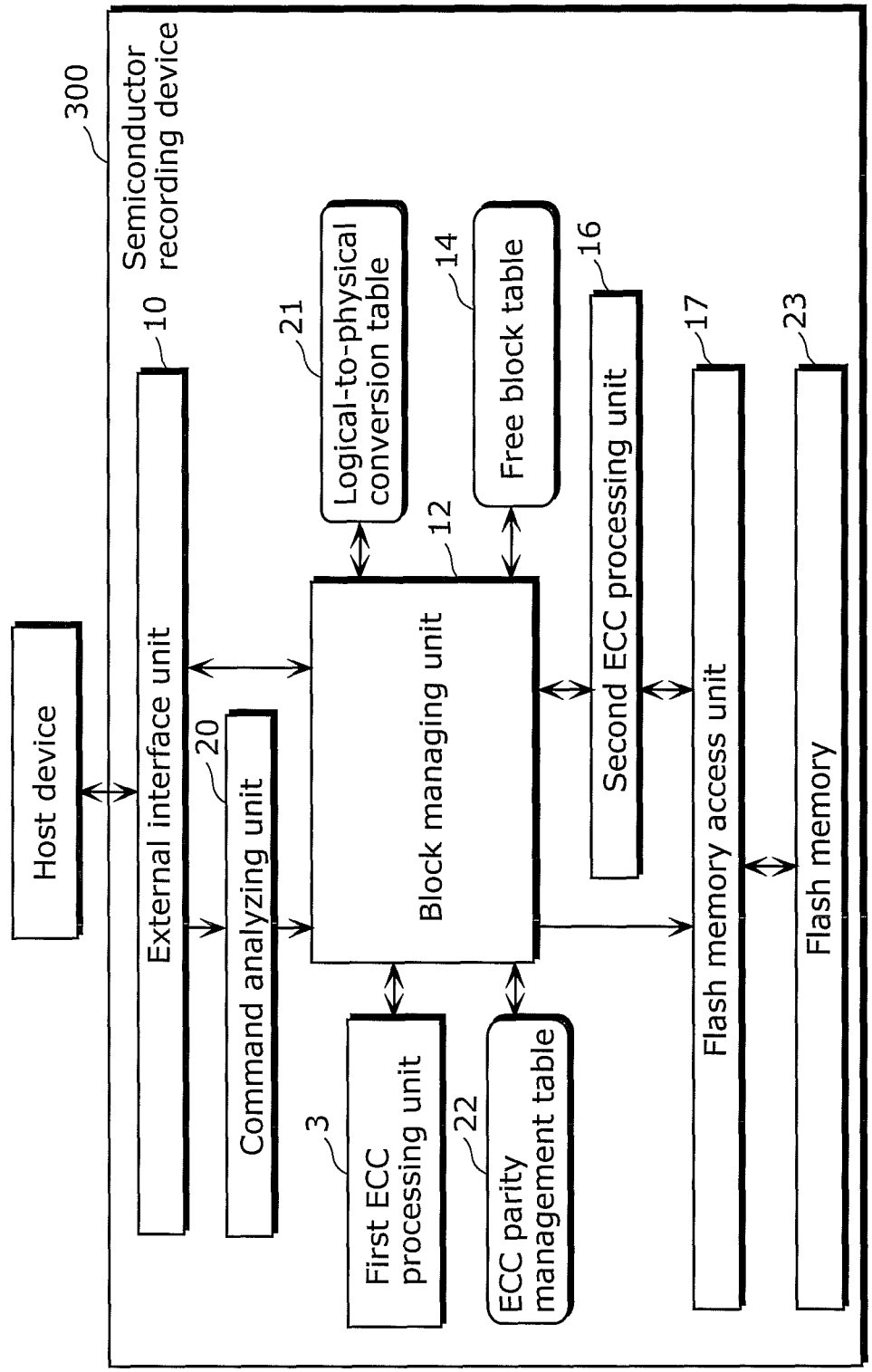
FIG. 9 is a diagram illustrating an overall structure of a semiconductor recording system according to Embodiment 2 of the present invention.

Next, reference is made to a semiconductor recording device and a semiconductor recording system according to Embodiment 2 of the present invention, with reference FIG. 9. FIG. 9 is a diagram illustrating an overall structure of the semiconductor recording system according to Embodiment 2 of the present invention.

The semiconductor recording system according to Embodiment 2 in FIG. 9 is a variation of the semiconductor recording system according to Embodiment 1 shown in FIG. 2. Thus, in FIG. 9, the same numerals are used for the elements having the same functions as those in FIG. 2, and their descriptions are omitted or simplified.

Embodiment 2 differs from Embodiment 1 in the following points. In Embodiment 1, the host device 100 is provided with the first ECC processing unit 3, and the first ECC code is generated by the host device 100. In Embodiment 2, the first ECC processing unit 3 is included in the semiconductor recording device 300, and the first ECC processing is switched between ON and OFF according to a parameter of a write command issued by the host device.

More specifically, in Embodiment 2, in the case where a write command of the integral multiple of the logical page (integral multiple of 16 KB) described in Embodiment 1 is issued, a first ECC code is generated and parity data is recorded. In the case where any other write commands are issued, the first ECC code is not generated, and parity data is not recorded.

Hereinafter, reference is made to an internal structure and the operations of semiconductor recording device 300 according to Embodiment 2, with reference to FIG. 9.

As shown in FIG. 9, the semiconductor recording device 300 according to Embodiment 2 includes: an external interface unit 10; a command analyzing unit 20; a block managing unit 12; a logical-to-physical conversion table 21; a free block table 14; an ECC parity management table 22; a second ECC processing unit 16; a flash memory access unit 17; a flash memory 23; and a first ECC processing unit 3.

In FIG. 9, the command analyzing unit 20 analyzes a write command corresponding to user data instructed by a host device to detect whether or not the size of the write command is integral multiple of logical page alignment (=16 KB). In the case where the write command is integral multiple of the alignment (=16 KB), the first ECC processing unit 3 generates a first ECC parity. On the other hand, in the case where the write command is not integral multiple of the alignment (=16 KB), the first ECC parity is not generated by the first ECC processing unit 3.

In the similar manner to Embodiment 1, the first ECC processing unit 3 generates a first ECC code based on user data. In Embodiment 2, the first ECC processing unit 3 reads user data by 1 byte at an interval of 4 KB and performs an EXOR operation on the user data of total 4 bytes so as to generate parity data of 1 byte. The size of one logical page in the flash memory 23 of the semiconductor recording device 300 is 16 KB; and thus, when parity data is sequentially generated, the first ECC processing unit 3 generates parity data of 4 KB per one logical page.

Figure 10:
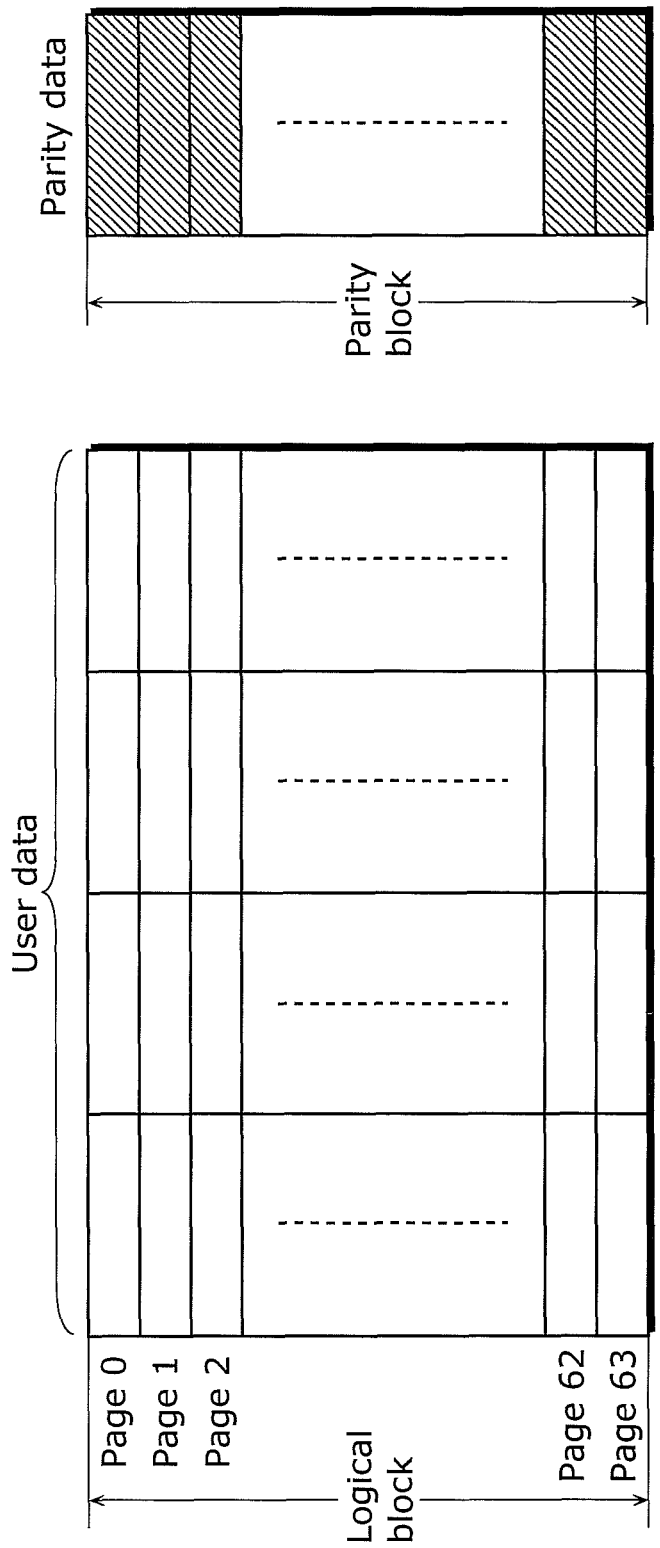
FIG. 10 is a conceptual diagram illustrating relationship between logical blocks and parity blocks in the semiconductor system according to Embodiment 2 of the present invention.

Here, reference is made to relationship between logical blocks and parity blocks in the semiconductor recording system according to Embodiment 2, with reference to FIG. 10. FIG. 10 is a conceptual diagram illustrating relationship between logical blocks and parity blocks in the semiconductor recording system according to Embodiment 2.

In Embodiment 2, the definitions of the logical block and parity block are different from those in Embodiment 1. More specifically, in Embodiment 1, one parity block is assigned to four logical blocks. However, in Embodiment 2, as shown in FIG. 10, one parity block corresponds to one logical block. In Embodiment 2, too, the ratio of the user data to the parity data is 4:1.

Thus, as shown in FIG. 10, one logical block includes four physical blocks of a flash memory, and one parity block includes one physical block of the flash memory. In Embodiment 1, the semiconductor recording device 200 includes four flash memories 18; however, in Embodiment 2, the semiconductor recording device 300 includes five flash memories 23.

In such a manner, the definitions of the logical block and the parity block are different between Embodiment 1 and Embodiment 2; and thus, the logical-to-physical conversion table 21 in Embodiment 2 is also different from that in Embodiment 1. Hereinafter, reference is made to the logical-to-physical conversion table in the semiconductor recording device 300 according to Embodiment 2, with reference to FIG. 11A and FIG. 11B. FIG. 11A illustrates an example of the logical-to-physical conversion table for the logical blocks in the semiconductor recording device 300 according to Embodiment 2. FIG. 11B illustrates an example of the logical-to-physical conversion table for the parity blocks in the semiconductor recording device 300.

As shown in FIG. 11A, the logical-to-physical conversion table 21 for the logical blocks is a correspondence table between each logical block number and physical block numbers assigned to the respective logical blocks, and stores physical block numbers corresponding to each of 1000 logical blocks numbered from 0 to 999. In such a manner, the physical blocks of the flash memories 23 are managed.

As shown in FIG. 11B, the logical-to-physical conversion table 21 for the parity blocks is a correspondence table between each parity block number and the physical block number assigned to the each parity block, and stores physical block numbers corresponding to respective 1000 parity blocks numbered from 0 to 999. In such a manner, the physical blocks of the flash memories 23 are managed.

As described, since five flash memories are used in Embodiment 2, logical block numbers defined as numbers 0 to 799 in Embodiment 1 are extended to numbers 0 to 999 in Embodiment 2. Furthermore, in Embodiment 1, the parity block numbers are defined as numbers 0 to 199; however, in Embodiment 2, the parity block numbers are 0 to 999 because one parity block corresponds to one logical block.

In FIG. 11A and FIG. 11B, codes such as "0-0" or "1-300" refer to the same as in Embodiment 1; and thus, their descriptions are omitted. Each logical block includes physical blocks from the respective flash memories numbered 0, 1, 2, and 3. Each parity block includes a physical block of the flash memory numbered 4.

Such logical-to-physical conversion tables 21 are updated in the same manner as in the logical-to-physical conversion tables 13 in Embodiment 1.

Next, reference is made to the ECC parity management table 22 according to Embodiment 2, with reference to FIG. 12. FIG. 12 is a diagram illustrating an example of the ECC parity management table in the semiconductor recording device 300 according to Embodiment 2.

The ECC parity management table 22 according to Embodiment 2 is a table for storing management information (data validity management information) indicating whether or not the parity data generated by the first ECC processing unit is valid.

In Embodiment 1, user data and parity data are sequentially transferred from the host device; however, in Embodiment 2, parity data is generated by the first ECC processing unit 3 in the semiconductor recording device 300. Thus, the ECC parity management table 22 in Embodiment 2 differs from that in Embodiment 1 in the structure.

More specifically, in Embodiment 1, validity of the parity data in the ECC parity management table 15 is managed per logical block; however, in Embodiment 2, as shown in FIG. 12, the validity of the parity data in the ECC parity management table 22 is managed per page of each parity block, that is, per logical page.

As shown in FIG. 12, the ECC parity management table 22 stores "1" or "0" as management information in each page of respective 1000 parity blocks having the parity block numbers of 0 to 999. When parity data is written which corresponds to the same-numbered logical page of the same numbered logical block, the management information "1" is stored indicating that the parity data is valid. When not, the management information "0" is stored indicating that the parity data is invalid.

In Embodiment 2, in the case where the size of the write command of the user data instructed by the host device is integral multiple of logical page alignment (=16 KB), parity data is generated by the first ECC processing unit 3, the parity data is written onto the parity block, and management information is updated so as to indicate that the parity data of the logical page in the ECC parity management table 22 is valid. On the other hand, in the case where the size of the write command of the user data instructed by the host device is not integral multiple of the alignment (=16 KB) and is less than the alignment, the processing by the first ECC processing unit 3 is not performed, and management information is updated so as to indicate that the parity data of the logical page of the ECC parity management table 22 is invalid.

Figure 13:
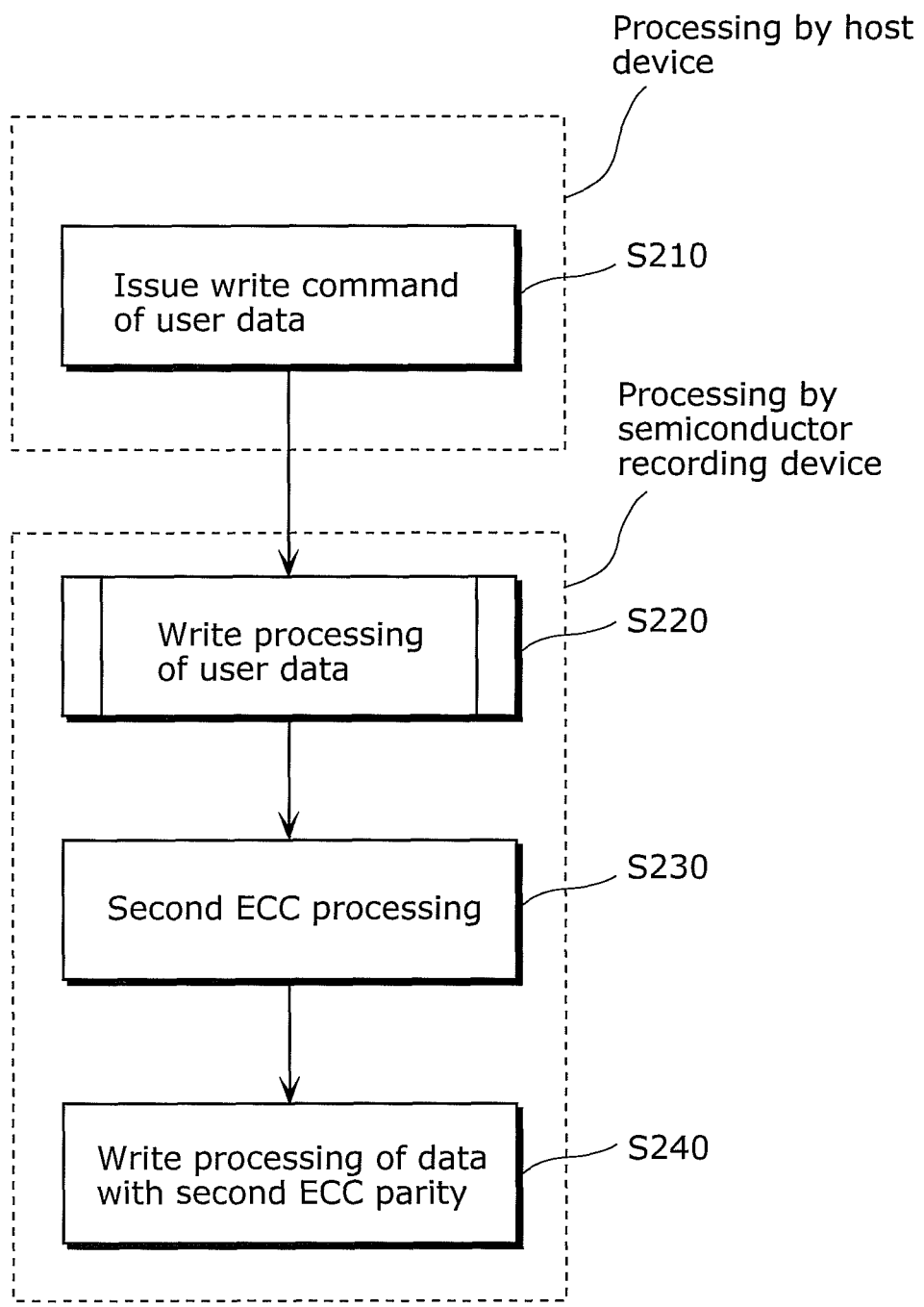
FIG. 13 is a flowchart of a write operation in the semiconductor recording system according to Embodiment 2 of the present invention.

Hereinafter, reference is made in detail to the write operation in the semiconductor recording system according to Embodiment 2, with reference to FIG. 9 and FIG. 13. FIG. 13 is a flowchart of a write operation in the semiconductor recording system according to Embodiment 2.

First, as shown in FIG. 13, the host device issues a write command related to user data to the semiconductor recording device 300 so as to instruct recording of the user data (S210).

Next, the semiconductor recording device 300 performs a write operation of the user data upon receipt of the write command related to the user data from the host device 100 (S220). The detail of the write operation of the user data will be described later.

Next, in the semiconductor recording device 300, the second ECC processing unit 16 performs second ECC processing (S230). This processing is the same as that in Embodiment 1.

After that, in the semiconductor recording device 300, the flash memory access unit 17 writes data with a second ECC parity (S240). This processing is also the same as that in Embodiment 1.

With this, the write operation of the semiconductor recording system according to Embodiment 2 ends.

Figure 14:
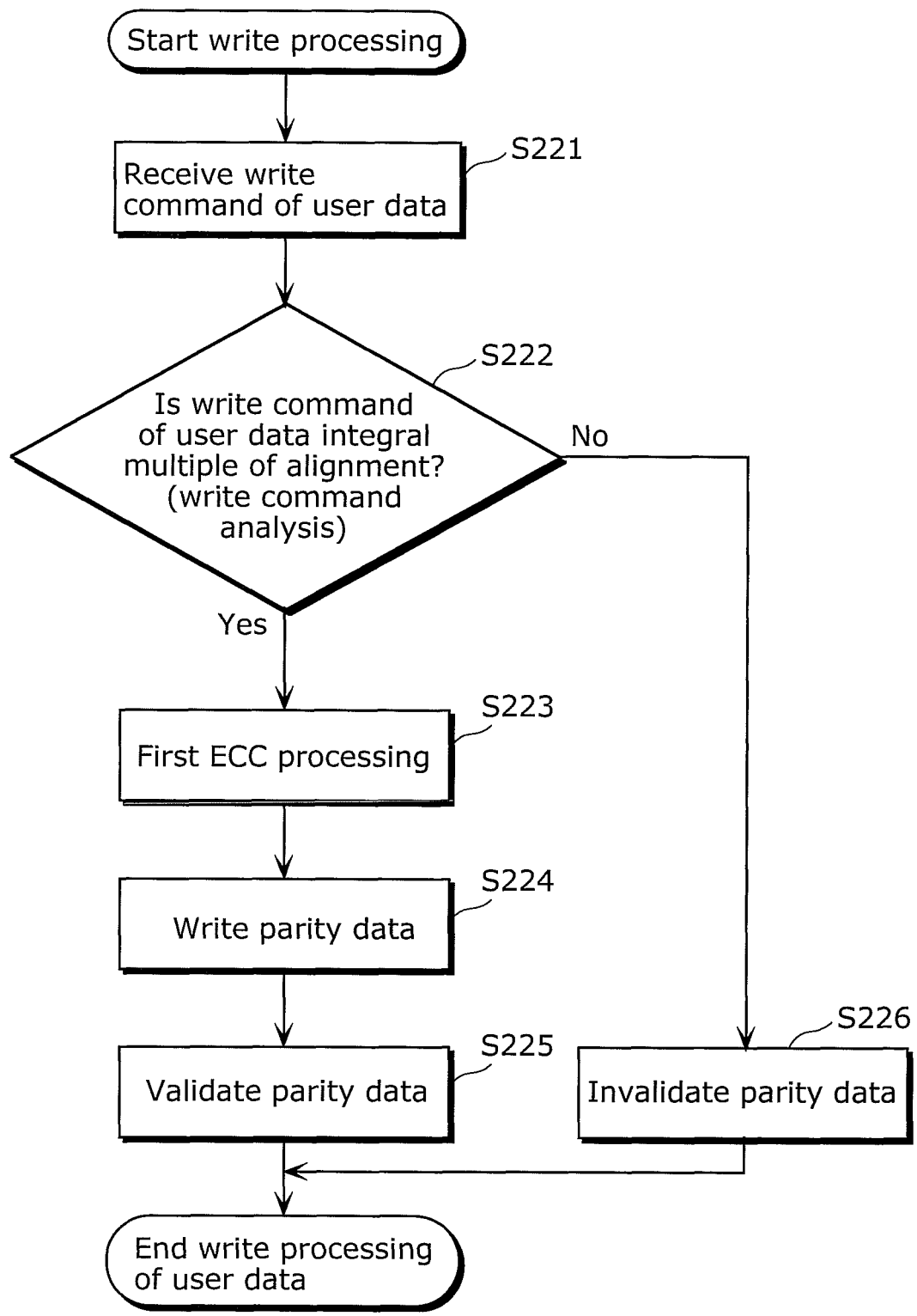
FIG. 14 is a flowchart of a write operation performed by the semiconductor recording device in the semiconductor recording system according to Embodiment 2 of the present invention.

Here, reference is made in detail to the write operation of the user data of the semiconductor recording device 300 (S220) shown in FIG. 13, with reference to FIG. 14. FIG. 14 is a flowchart of the write operation performed by the semiconductor recording device 300 in the semiconductor recording system according to Embodiment 2.

As shown in FIG. 14, the semiconductor recording device 300 receives write commands of user data from the host device 100 through the external interface unit 10 (S221).

Next, the write commands received through the external interface unit 10 are analyzed by the command analyzing unit 20 (S222). Here, the command analyzing unit 20 detects whether or not the write command of the user data instructed by the host device is integral multiple of the logical page alignment (=16 KB).

In the case where the write command is integral multiple of the alignment (=16 KB) (Yes in S222), the user data is written and the first ECC processing is performed (S223). In this case, the first ECC processing unit 3 generates parity data based on the user data, and generates a first ECC parity.

Then, the block managing unit 12 writes the parity data generated by the first ECC processing unit 3 onto the parity block of the flash memory 23 through the flash memory access unit 17 (S224).

The block managing unit 12 writes the parity data and also updates the management information so as to indicate that the parity data of the logical page in the ECC parity management table 22 is valid (S225).

On the other hand, in the write command analysis (S222), in the case where the write command is not integral multiple of alignment (=16 KB) (No in S222), the write operation of the user data is performed. However, the processing by the first ECC processing unit 3 is not performed, and the management information is updated so as to indicate that the parity data of the logical page in the ECC parity management table 22 is invalid (S226).

With this, the write operation of the user data in the semiconductor recording system according to Embodiment 2 ends.

In such a manner, in Embodiment 2, whether the parity data is written or not is selected according to the write command of the user data instructed by the host device. Accordingly, in reading user data, false error correction can be prevented by detecting the validity of the parity data of the logical page to be read in the ECC parity management table 22 and then determining whether or not the error can be corrected by using the parity data.

As described, in Embodiment 2, whether or not the parity data of the logical page of the user data is written is selected according to the write command of the user data instructed by the host device, the result of the selection is stored in the ECC parity management table 22, and the parity data and the ECC parity management table are written. As a result, it is possible to provide a reliable semiconductor recording device without scarifying write capability of small blocks.

By redundantly writing system data such as FAT that is written in small blocks, it is possible to prevent reliability from being reduced due to not adding parity data to data of the small blocks for recording. It is also possible to have both reliability and write capability of small blocks.

In Embodiment 2, the bit indicating the validity of the parity data in the ECC parity management table 22 may be written to each page of the parity block.

In Embodiment 2, the bit indicating the validity of the parity data in the ECC parity management table 22 may be written to each logical page of the logical block.

Furthermore, in Embodiment 2, whether or not the parity data is written is selected depending on the size of the write command; however, of course, such a control may be performed that parity data is written only based on a dedicated write command as in Embodiment 1.

The semiconductor recording device, the semiconductor recording system and the control method of the semiconductor recording device have been described based on the embodiments of the present invention; however, the present invention should not be limited to these embodiments.

For example, the control method of the semiconductor recording device according to the embodiments may be implemented by a computer program executed by a computer. Furthermore, the computer program for the control method of the semiconductor recording device may be recorded in a recording medium that is readable by a computer. Examples of the recording medium include a magnetic disk, an optical disc, a magnetic optical disc, an IC (Integrated Circuit) card, a semiconductor memory, a flexible disk, a hard disk, a CD-ROM (Compact Disc Read Only Memory), a DVD (Digital Versatile Disc), a DVD-ROM, a DVD-RAM (Random Access Memory), a BD (Blu-ray Disc) (registered trademark).

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

A semiconductor recording device according to the present invention relates to a semiconductor recording device such as a memory card, and in particular, addresses the problems of a deterioration in the data holding characteristics of an internal nonvolatile memory and post-fabrication semiconductor defects. By generating and writing ECC codes extending across the physical blocks of the non-volatile memory, it is possible to reduce post-fabrication defects of physical blocks and variations in data holding characteristics of the blocks. Thus, the present invention is useful, for example, for a semiconductor recording device which uses a multi-value cell flash memory which has poor data holding characteristics and a semiconductor recording system in the field of professional-use video recording which requires high reliability.

What is claimed is:

1. A semiconductor recording device comprising:
   a non-volatile memory on which user data and parity data are to be recorded;
   an interface unit configured to receive a first write command for instructing recording of the user data onto a specified area of said non-volatile memory; and
   a managing unit configured to manage management information indicating whether the parity data is valid or invalid,
   wherein, when the user data related to the first write command received through said interface unit is recorded onto the specified area of said non-volatile memory, said managing unit is configured to update the management information so as to indicate that the parity data, which has been recorded onto said non-volatile memory prior to the user data being recorded, is invalid.

2. The semiconductor recording device according to claim 1, further comprising
   a management table which stores the management information,
   wherein said managing unit is configured to manage the management information by updating the management information stored in said management table.

3. The semiconductor recording device according to claim 2,
   wherein said non-volatile memory includes a block that is a unit of erasing, and
   the management information is stored per block in said management table.

4. The semiconductor recording device according to claim 2,
   wherein said non-volatile memory includes a block having a plurality of pages, each of the pages being a minimum unit of recording, and
   the management information is stored per page in said management table.

5. The semiconductor recording device according to claim 1,
   wherein said interface unit is configured to receive a second write command for instructing recording of the parity data,
   said semiconductor recording device further comprises a command analyzing unit configured to identify whether a received command is the first write command or the second write command, and
   said managing unit is configured to (i) update the management information so as to indicate that the parity data is invalid, in the case where said command analyzing unit identifies that the received write command is the first write command, and (ii) update the management information so as to indicate that the parity data is valid, in the case where said command analyzing unit identifies that the received write command is the second write command.

6. The semiconductor recording device according to claim 5,
   wherein said interface unit is configured to receive the second write command after receiving the first write command, and
   said managing unit is configured to update the management information according to the second write command so as to indicate that the parity data is valid, after updating the management information according to the first write command so as to indicate that the parity data is invalid.

7. The semiconductor recording device according to claim 1, further comprising
   an ECC processing unit configured to generate the parity data corresponding to the user data related to the first write command, and generate an ECC code including the user data and the parity data.

8. The semiconductor recording device according to claim 7, further comprising
   a command analyzing unit configured to analyze the first write command to detect whether or not a size of the first write command is integral multiple of a predetermined size,
   wherein said ECC processing unit is configured (i) to generate the ECC code in the case where said command analyzing unit detects that the size of the first write command is integral multiple of the predetermined size, and (i) not to generate the ECC code in the case where said command analyzing unit detects that the size of the write command is not integral multiple of the predetermined size.

9. The semiconductor recording device according to claim 8,
   wherein, said managing unit is configured to (i) update the management information so as to indicate that the recorded parity data is valid, in the case where said command analyzing unit detects that the size of the first write command is integral multiple of the predetermined size, and (ii) update the management information so as to indicate that the recorded parity data is invalid, in the case where said command analyzing unit detects that the size of the first write command is not integral multiple of the predetermined size.

10. A semiconductor recording system comprising a host device and a semiconductor recording device,
    wherein said host device includes:
    an external interface unit configured to transmit and receive a command to and from said semiconductor recording device,
    an ECC processing unit configured to generate parity data corresponding to user data, and an ECC code including the user data and the parity data;
    a first command processing unit configured to generate a first write command related to the user data; and
    a second command processing unit configured to generate a second write command related to the parity data,
    wherein said semiconductor recording device includes:
    a non-volatile memory on which the user data and the parity data are to be recorded;
    an interface unit configured to receive the first write command for instructing recording of the user data onto a specified area of said non-volatile memory; and
    a managing unit configured to manage management information indicating whether the parity data is valid or invalid,
    wherein, when the user data related to the first write command received through said external interface unit is recorded onto the specified area of said non-volatile memory, said managing unit is configured to update the management information so as to indicate that the parity data, which has been recorded onto said non-volatile memory prior to the user data being recorded, is invalid.

11. The semiconductor recording system according to claim 10,
    wherein, when transmitting the first write command and the second write command to said semiconductor recording device through said external interface unit, said host device transmits the second write command after transmitting the first write command, said semiconductor recording device further includes a management table, and said management unit is configured to (i) update the management information at a start of recording the user data corresponding to the first write command, so as to indicate that the parity data is invalid, and (ii) update the management information at an end of recording the parity data corresponding to the second write command, so as to indicate that the parity data is valid.

12. The semiconductor recording system according to claim 10, wherein said managing unit is configured to selectively perform a write operation that is based on the second write command.

13. The semiconductor recording system according to claim 10, wherein said first command processing unit is configured to generate the first write command by using a general-purpose driver.

14. The semiconductor recording system according to claim 10, wherein said managing unit is configured to record the parity data corresponding to the second write command in an area of said non-volatile memory, the area being inaccessible by a general-purpose driver.

15. A method of controlling a semiconductor recording device which includes: a non-volatile memory on which user data and parity data are to be recorded; an interface unit which receives a first write command for instructing recording of the user data onto a specified area of the non-volatile memory; and a managing unit which manages management information indicating whether the parity data is valid or invalid, said method comprising:

updating the management information so as to indicate that the parity data, which has been recorded onto the non-volatile memory prior to the user data being recorded, is invalid, when the user data related to the first write command received through the interface unit is recorded onto the specified area of the non-volatile memory.

* * * * *